United States Patent
Kubena et al.

(10) Patent No.: US 11,431,293 B1
(45) Date of Patent: Aug. 30, 2022

(54) NOISE SUPPRESSION IN A PHONONIC COMB

(71) Applicant: HRL Laboratories, LLC, Malibu, CA (US)

(72) Inventors: Randall L. Kubena, Oak Park, CA (US); Walter S. Wall, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/348,344

(22) Filed: Jun. 15, 2021

Related U.S. Application Data

(60) Provisional application No. 63/083,619, filed on Sep. 25, 2020.

(51) Int. Cl.
*H03B 5/30* (2006.01)
*H03H 9/17* (2006.01)
(Continued)

(52) U.S. Cl.
CPC .............. *H03B 5/366* (2013.01); *G02F 1/353* (2013.01); *H03H 9/19* (2013.01); *H03L 7/16* (2013.01);
(Continued)

(58) Field of Classification Search
CPC .. G01R 33/022; G01V 7/005; G02F 2203/56; H03B 5/30; H03B 5/32; H03B 5/366;
(Continued)

(56) References Cited

U.S. PATENT DOCUMENTS 4,070,635 A * 1/1978 Healey, III .............. G01S 13/24
331/135
4,132,964 A 1/1979 Wilcox
(Continued)

FOREIGN PATENT DOCUMENTS

KR 10-2012-0132987 A 12/2012
KR 10-2008-0044977 A 5/2018
(Continued)

OTHER PUBLICATIONS

"PM-AM correlation measurements and analysis," Howe, D. A., Hati, A., Nelson, C. W., & Lirette, D., May 2012, IEEE International Frequency Control Symposium Proceedings (pp. 1-5). IEEE.
(Continued)

*Primary Examiner* — Levi Gannon
(74) *Attorney, Agent, or Firm* — Ladas & Parry, LLP

(57) ABSTRACT

A method and apparatus for increasing the Signal-to-Noise Ratio (SNR) of phononic comb teeth generated by a non-linear resonator. The method comprises generating a drive signal; applying the drive signal to the non-linear resonator with sufficient gain to generate the phononic comb teeth; and filtering the drive signal before applying it to the non-linear resonator to thereby increase the Signal-to-Noise Ratio (SNR) of phononic comb teeth generated by the non-linear resonator. The apparatus may comprise a circuit including a filter disposed between an oscillator generating the drive signal and the non-linear resonator, the filter preferably having a 3 db passband width which is less than a spacing of the phononic comb teeth generated by the non-linear resonator.

27 Claims, 5 Drawing Sheets

(51) Int. Cl.
*H03B 5/36* (2006.01)
*G02F 1/35* (2006.01)
*H03L 7/16* (2006.01)
*H03H 9/19* (2006.01)

(52) U.S. Cl.
CPC .. *G02F 2203/56* (2013.01); *H03B 2200/0054* (2013.01)

(58) Field of Classification Search
CPC ... H03B 5/368; H03B 2200/0054; H03H 9/19
See application file for complete search history.

(56) References Cited

U.S. PATENT DOCUMENTS

| | | | |
|---|---|---|---|
| 7,750,535 | B2 | 7/2010 | Kubena |
| 7,851,971 | B2 | 12/2010 | Chang |
| 8,601,607 | B2 | 12/2013 | Hagmann |
| 8,765,615 | B1 | 7/2014 | Chang |
| 8,994,465 | B1 | 3/2015 | Kubena |
| 10,110,198 | B1 | 10/2018 | Kubena |
| 10,389,392 | B1 | 8/2019 | Kubena |
| 2010/0321117 | A1 | 12/2010 | Gan |
| 2012/0294319 | A1* | 11/2012 | Maleki .................. G02F 1/39 372/18 |
| 2017/0047893 | A1* | 2/2017 | Nguyen ................. H03H 9/171 |
| 2018/0157148 | A1 | 6/2018 | Kim |
| 2019/0250198 | A1 | 8/2019 | Kubena |
| 2020/0158769 | A1 | 5/2020 | Liu |
| 2021/0091748 | A1 | 3/2021 | Kubena |

FOREIGN PATENT DOCUMENTS

| | | |
|---|---|---|
| WO | 2014-018444 A2 | 1/2014 |
| WO | 2019/217668 A1 | 11/2019 |

OTHER PUBLICATIONS

"Reducing oscillator PM noise from AM-PM noise correlation," Hati, Archita, Craig W. Nelson, and David A. Howe, Electronics letters 50.17 (2014): 1195-1197.
"A Fully Integrated Quartz MEMS VHF TCXO," R. L. Kubena, et al., 2017 IEEE Frequency Control Symposium, Besancon, Fr., pp. 68-71, Jul. 2017.
R. L. Kubena, W. S. Wall, J. Koehl, and R. J. Joyce, "Phononic comb generation in high-Q quartz resonators", Applied Physics Letters 116, 053501 (2020) https://doi.org/10.1063/1.5128930.
"Phase Detector/Frequency Synthesizer: ADF4002 Data Sheet" Analog Devices 2006-2015, http://www.analog.com, pp. 1-20.
U.S. Appl. No. 16/932,427, filed Jul. 17, 2020, Kubena.
U.S. Appl. No. 16/932,431, filed Jul. 17, 2020, Kubena.
U.S. Appl. No. 16/932,447, filed Jul. 17, 2020, Kubena.
U.S. Appl. No. 16/932,455, filed Jul. 17, 2020, Kubena.
U.S. Appl. No. 15/965,652, filed Apr. 27, 2018, Kubena.
U.S. Appl. No. 16/370,602, filed Mar. 29, 2019, Kubena.
U.S. Appl. No. 16/512,091, filed Jul. 15, 2019, Sorenson.
U.S. Appl. No. 16/775,242, filed Jan. 28, 2020, Kubena.
PCT International Search Report and Written Opinion from PCT/US2020/051863 dated Jan. 4, 2021.
From U.S. Appl. No. 16/932,455 (now published as US 2021-0091748), office action dated Apr. 22, 2021.
From U.S. Appl. No. 16/932,455 (now published as US 2021-0091748), Notice of Allowance dated Jun. 23, 2021.
Askari, S. et al., "Near-Navigation Grade Quad Mass Gyroscope With Q-Factor Limited By Thermo-Elastic Damping," Solid-State, Actuators, and Microsystems Workshop Technical Digest, Hilton Head, South Carolina, USA, 2016, pp. 254-257.
Bennett, S. P. et al., "Magnetic Field Response of Doubly Clamped Magnetoelectric Microelectromechanical AlN-FeCo Resonators," Applied Physics Letters 111, 252903 (2017).
Bhatia, A. et al., "Linearization of Phase-Modulated Analog Optical Links using a Four-Wave Mixing Comb Source," Optics Express, DOI: 10.1364/OE 22.030899, Dec. 4, 2014.
Chang, et al., "Nonlinear UHF Quartz MEMS Oscillator with Phase Noise Reduction," 26th IEEE International Conference on MicroElectroMechanical Systems, Taipei, Taiwan, Jan. 20-24, 2013, pp. 781-784.
Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).
Ganesan, A., et al., "Phononic Frequency Combs For Engineering MEMS/NEMS Devices With Tunable Sensitivity," 2019 IEEE (4 pages).
Ganesan, A. et al., "Phononic Frequency Comb via Intrinsic Three-Way Mixing," Physical Review Letters, PRL 118, 033903 (2017), (5 pages).
Hui, Y. et al., High Resolution Magnetometer Based on a High Frequency Magnetoelectric MEMS-CMOS Oscillator, Journal of Micromechanical Systems, vol. 24, No. 1, Feb. 2015, pp. 134-143.
Kominis, et al., "A subfemtotesla multichannel atomic magnetometer," Nature, vol. 422, pp. 596-599 (2003).
Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.
Nan, et.al., "Acoustically Actuated Ultra-Compact NEMS Magnetoelectric Antenna," Nature Communications, 8:296, DOI: 10.1038/s41467-017-00343-8 (2017), pp. 1-8.
Sheng, et al., "A Microfabricated Optically-Pumped Magnetic Gradiometer," Applied Physics Letters 110, 031106 (2017).
Veryaskin, A. "Gravity, Magnetic and Electromagnetic Gradiometry: Strategic Technologies in the 21st century", IOP ebooks, 2018 (57 pages).
Vrba, J., "Squid Sensors: Fundamentals, Fabrication and Applications," edited by H. Weinstock, Kluwer Academic, Dordrecht, The Netherlands, 1996, p. 117.
Wall, Walter S., et al., "Phase Noise Transfer in High-Q Quartz Phononic Frequency Combs," IEEE, 2020 (4 pages).
Wang, S. et al., "A MEMS Resonant Accelerometer for Low-Frequency Vibration Detection," Sensors and Actuators A: Physical, 283, Nov. 2018, pp. 151-158.
WenJie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.
Yao, et al., "Bulk Acoustic Wave-Mediated Multiferroic Antennas: Architecture and Performance Bound," IEEE Transactions on Antennas and Propagation, vol. 63, No. 8, Aug. 2015.
Zhai, J.., et al., "Detection of Pico-Tesla Magnetic Fields using Magneto-Electric Sensors at Room Temperature," Applied Physics Letters, 88, 062510 (2006).
PCT International Preliminary Report on Patentability (Chapter I) with Written Opinion from PCT/US2020/051863 dated Apr. 7, 2022.

* cited by examiner

NOISE SUPPRESSION IN A PHONONIC COMB

CROSS REFERENCE TO RELATED APPLICATIONS

This application claims the benefit of U.S. Provisional Patent Application Ser. No. 63/083,619 filed 25 Sep. 2020 and entitled "Noise Suppression in a Phononic Comb", the disclosure of which is hereby incorporated herein by reference.

This application is related to U.S. Provisional Patent Application Ser. No. 62/904,052 filed 23 Sep. 2019 and entitled "Enhanced Stability Oscillators using a Phononic Comb" and to its corresponding Non-Provisional patent application Ser. No. 16/932,455, filed on 17 Jul. 2020 and also entitled "Enhanced Stability Oscillators using a Phononic Comb", the disclosures of which are hereby incorporated herein by reference.

This application is also related to the technology disclosed in U.S. Provisional Patent Application Ser. No. 62/881,069, filed 31 Jul. 2019 and entitled "Phononic Comb Enhanced Gradiometers" and its corresponding non-Provisional U.S. patent application Ser. No. 16/932,431 filed on 17 Jul. 2020, also entitled "Phononic Comb Enhanced Gradiometers", the disclosures of which are hereby incorporated herein by reference.

This application is further related to the technology disclosed in US Provisional Patent Application Ser. No. 62/890,799, filed 23 Aug. 2019 and entitled "Phononic Comb Enhanced MEMS Gravity Gradiometer" and its corresponding non-Provisional U.S. patent application Ser. No. 16/932,447 filed on 17 Jul. 2020, and also entitled "Phononic Comb Enhanced MEMS Gravity Gradiometer", the disclosures of which are hereby incorporated herein by reference.

STATEMENT REGARDING FEDERALLY SPONSORED RESEARCH OR DEVELOPMENT

None

TECHNICAL FIELD

An apparatus and method for reducing noise in circuits generating phononic combs used in either oscillators or gradiometers.

BACKGROUND

Reference oscillators are used, for example, in radar, GPS and other navigation and location systems. Typically, the ultimate accuracy of these systems is determined by the stability of those reference oscillators. In addition, low phase noise oscillators determine the limits within many sensor systems and networks, such as under water sonar networks. It is estimated that a typical car has over forty clocks inside to control networks and subsystems. Finally, low phase noise oscillators are used in frequency synthesizers in software defined radios and other frequency agile communication systems. Each commercial cell phone has a Temperature Compensated Crystal Oscillator (TCXO) inside for transmit and receive operations.

TCXOs are used in many clock applications and have a small size and low power (typically around 15 $mm^3$ and <10 mW, respectively). However, they can drift about 0.2 ppm over temperature and have typical phase noise of −90 dBc/Hz @ 10 Hz and −140 dBc/Hz @ 1 to 10 kHz. Low cost TCXOs have g-sensitivities of $1\times10^{-9}$/g, and g-hardened TCXOs can have g-sensitivities of ~$2\text{-}5\times10^{-11}$/g. To achieve higher stability, Oven Controlled Crystal Oscillators (OCXOs) are used. Miniaturized OCXOs typically have larger volumes of about 1000 $mm^3$ and use >150 mW of power. They provide temperature stability of <50 ppb and phase noise of around −120 to −135 dBc/Hz @ 10 Hz and −170 dBc/Hz @ 1 to 10 kHz. However, OCXOs can have higher g-sensitivity than g-hardened TCXOs. To further improve the temperature stability and phase noise at lower offset frequencies, Chip-Scale Atomic Clocks (CSAC) have been developed. However, their size and power are even larger than OCXOs by roughly an order of magnitude.

All of these just mentioned technologies are limited by electronic sustaining circuit noise at offset frequencies from a carrier greater than about 1 kHz. In this range, environment noise from the resonator used in these oscillators is no longer dominant (from thermal or vibration effects) and frequency flicker and white phase noise from the electronic components around the resonator limit the timing jitter (determined by the integral of the phase noise from roughly 1-10 kHz to 1 MHz). For communication, radar, and digital system applications, timing jitter is critical for system bandwidth, resolution, accuracy, and signal-to-noise. Thus, improving the timing jitter is desirable for advanced digital system, and more specifically, there is a need for a true chip-scale low timing jitter clock that uses no more than 10-30 mW of power and can be integrated with other digital electronics. Typically, commercial clocks can provide timing jitter in the sub-100 fs range, but 10 fs is needed for many new applications. Since phase noise increases as signals are multiplied up in frequency from typical oscillator frequencies of 10-100 MHz, timing jitter becomes a more important issue at GHz frequencies. Electro-optical based resonators have shown ultra-low phase noise at GHz frequenices (−135 dBc/Hz at 10 GHz), but to date have required large systems and high power >>10 W. Thus, a technique that reduces timing jitter for an array of different types of clocks that is low cost and low power would be beneficial.

As described in U.S. Provisional Patent Application Ser. No. 62/904,052 filed 23 Sep. 2019 and to its corresponding Non-Provisional patent application Ser. No. 16/932,455, filed on 17 Jul. 2020, certain teeth of a phononic comb can show much smaller frequency modulation sensitivity compared to the drive signal. See also "Phononic Comb Generation in High-Q Quartz Resonators," R. L. Kubena, W. S. Wall, J. Koehl, and R. J. Joyce, *Applied Physics Letters*, 116, 053501, Feb. 4, 2020, a copy of which is attached hereto as Appendix A and is hereby incorporated herein by reference. This smaller frequency modulation sensitivity has been shown to reduce phase noise induced on the drive signal. However, the phase noise of the comb teeth can be limited by a smaller signal-to-noise ratio (SNR) of the teeth compared to the drive signal, where the SNR is defined as the ratio of the rms power at the signal center frequency to the average rms power in nearby frequency bands. In this disclosure a method to increase the SNR of the teeth of the comb using a selectively tuned pre-filter prior to the drive signal being applied to the nonlinear resonator is described. Since the signal strength of the teeth of a phononic comb is determined by the nonlinear response of a resonator to a drive signal, and the noise floor of the comb has been observed to be due to the noise floor of the drive, this provides a path for pre-filtering the drive signal using conventional filters without affecting the comb generation or the amplitude of the teeth. Thus, the phase noise contribution from the SNR can be reduced for the teeth to a level below that of other contributions. If particular comb teeth are used for locking to a reference oscillator with a similar phase noise as the drive signal using a phase lock loop, the phase noise of the reference oscillator can be improved provided that the instabilities due to the nonlinear resonator are controlled (such as temperature induced drifts or AM to PM noise conversion).

Low phase noise is required for many applications including radar, navigation, and communication. There is a need to improve the phase noise and reduce the size, weight and power of reference oscillators. Nonlinear effects such as Duffing in MEMS resonators have been explored in the past to improve phase noise. This disclosure described a related but different effect that can occur in resonators when they are driven nonlinearly. When a phononic comb is produced through mixing of local modes within the resonator which is driven slightly off its resonant frequency, the comb teeth can exhibit regions of low drive frequency sensitivity. This effect can be utilized to reduce the phase noise on the drive signal. However, if the SNR of the comb teeth is smaller than the drive signal, the amount of phase noise reduction can be limited especially at low phase noise level. Thus, to reduce the phase noise below SoA levels, one must also provide comb output SNRs at least as large as the drive signal. This disclosure describes a method to increase the SNR of the comb teeth using conventional RF filters which could be integrated on chips containing the nonlinear resonator.

This document describes improving clock performance using a phononic frequency comb. We are not limiting the invention to only phononic combs produced in quartz resonators. This technology may be applied to other resonator types (i.e., Si, AlN, SiC, etc.) preferably of MEMS type construction but with nonlinear properties.

BRIEF DESCRIPTION OF THE INVENTION

This disclosure describes a method to increase the SNR of phononic comb teeth, thereby reducing this limitation factor in the phase noise of the teeth. Since phononic combs have only been observed experimentally during the past several years, there has been no published results on the phase noise of the teeth. Recently, the inventors herein, employed by HRL Laboratories (hereinafter "HRL") of Malibu, Calif., have observed that under particular conditions of drive frequency, input power, Q, and temperatures teeth can be formed with frequencies that are very insensitive to the drive frequencies.

Measurements have shown that the phase noise of these teeth are lower than the phase noise of a high noise drive signal. However, as the noise on the drive signal is reduced, the SNR of the teeth eventually limit the amount of reduction that can be obtained using teeth with low input noise sensitivity. Moreover, the discovery of phononic combs at HRL with >10-kHz teeth separation makes this innovation practical with conventional high-Q filters. Thus, without this knowledge, this innovation would not be obvious to other oscillator developers.

In one aspect the present invention provides a method for increasing the Signal to Noise Ratio (SNR) of phononic comb teeth generated by a non-linear resonator, the method comprising: generating a drive signal; applying the drive signal to the non-linear resonator with sufficient gain to generate the phononic comb teeth; and filtering the drive signal before applying it to the non-linear resonator to thereby increase the Noise Ratio (SNR) of phononic comb teeth generated by the non-linear resonator.

In another aspect the present invention also provides an apparatus generating phononic comb teeth comprising: an oscillator generating a drive signal; a resonator; means for applying the drive signal to the resonator with sufficient gain to cause the resonator to enter a non-linear state wherein it generates an output having a phononic comb comprising a plurality of phononic teeth; and a filter for filtering the drive signal before applying it to the resonator to thereby increase the Noise Ratio (SNR) of phononic comb teeth generated by the resonator.

In yet another aspect the present invention provides a circuit for improving a Signal to Noise Ratio (SNR) of phononic comb teeth generated by a non-linear resonator that is pumped by an oscillator generating a drive signal with sufficient gain to cause the phononic comb teeth to be generated by the non-linear resonator, the circuit comprising a filter disposed between the oscillator and the non-linear resonator, the filter preferably having a 3 db passband width which is less than a teeth spacing of the phononic comb teeth generated by the non-linear resonator.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Figure 1:
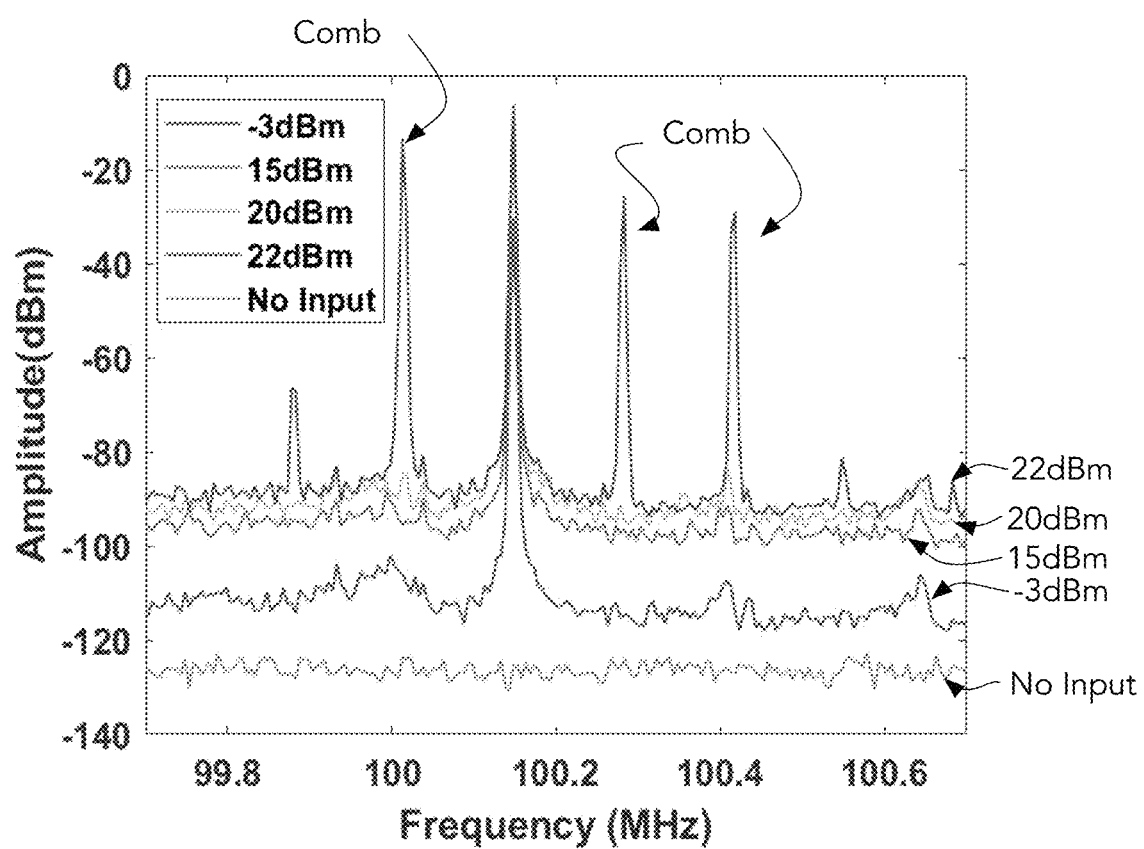
FIG. 1 is a graph of the SNR of the drive signal at various power level and the SNR of the teeth of the comb above 22 dBm for a 100 MHz quartz shear-mode resonator.
Figure 2:
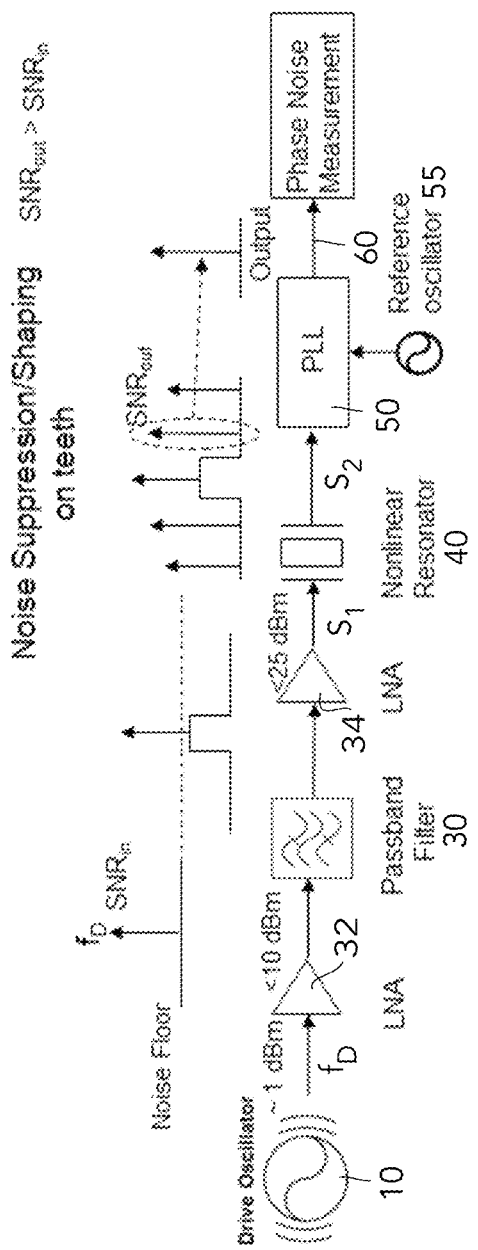
FIG. 2 is a schematic diagram of a clock circuit that makes use of the concept disclosed herein for increasing (improving) the SNR of the comb teeth by using a passband filter to reduce the noise floor of the clock's drive signal.

An example of a phononic comb produced in AT-cut quartz resonators is shown in FIG. 1. In this figure, several frequency spectra are shown at different power levels for the input drive (from a Drive Oscillator 10, as depicted in FIG. 2). One can see that there is no comb formation until the drive signal power is increased to 22 dBm. In this example, the drive frequency from Drive Oscillator 10 was set higher than the shear-mode series resonance in the tested resonator by about 125 kHz. One can also see that the background noise floor exactly tracks the input power both before and after comb formation. This indicates that the nonlinear processes responsible for comb formation do not increase the background noise level generated by the drive signal source. However, the amplitude of each tooth in the comb is related to the drive power and the coupling efficiencies between it and the quartz modes responsible for the comb formation. Thus, if one filters the drive signal noise floor with a passband filter (see filter 30 of FIGS. 2 and 4) centered at the drive frequency and with a Half Band Width (HBW) preferably equal to less than the teeth separation Band Width (BW), the noise floor at each tooth can be reduced without significantly affecting the peak amplitude of each tooth. Depending on the number of poles for the filter, the out-of-band rejection at the teeth frequency locations can be suppressed by various amounts. For example, a 2-pole monolithic crystal filter can suppress the drive signal noise at the teeth by a maximum of about 20 dB while a 4-pole filter can suppress the noise by roughly 40 dB. Higher order filters can be used for even greater suppression.

Figure 4:
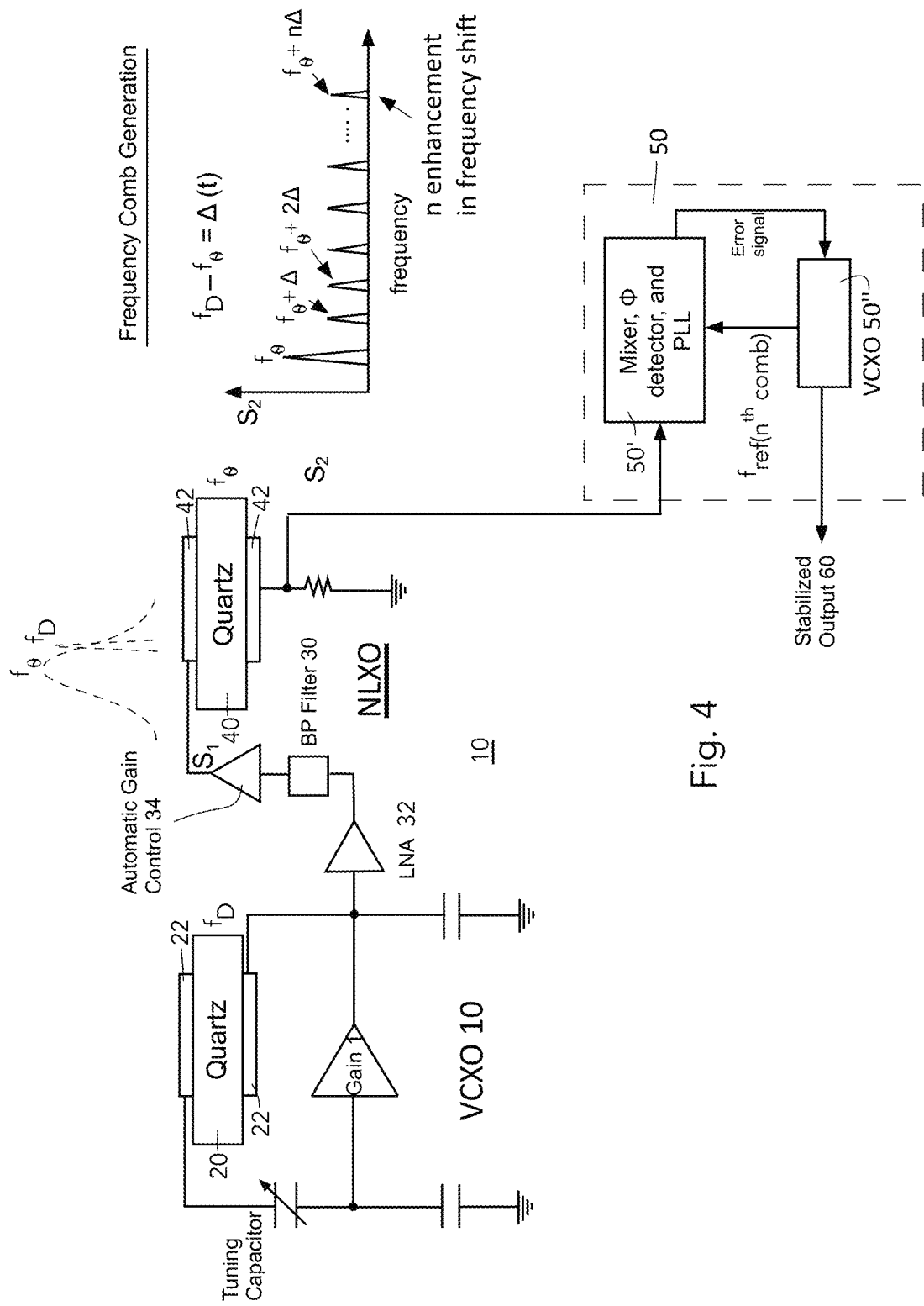
FIG. 4 is a schematic drawing depicting a clock circuit that makes use of the concept disclosed herein for increasing (improving) the SNR of the comb teeth by using a passband filter to reduce the noise floor of the clock's drive signal depicted in greater detail than that shown in FIG. 2, the frequency comb being enhanced using a drive VCXO which coupled to a resonator driven off-resonance to produce the comb, a reference VCXO which is stabilized using the $n^{th}$ tooth of the comb preferably at a point with its slope (defined as the first derivative of the drive frequency versus the tooth output) >1 and with a passband filter to reduce the noise floor of the drive signal. The comb tuning signal is used to position the drive frequency at this point.

This filtering concept is shown in FIG. 2. The Drive Oscillator 10 is depicted generically, but preferably comprises an oscillator circuit 10 utilizing a quartz resonator 20 (see also FIG. 4). FIG. 4 shows how the filtering concept of FIG. 2 may be applied to the oscillator depicted in FIG. 1 of U.S. Provisional Patent Application Ser. No. 62/904,052 filed 23 Sep. 2019 and entitled "Enhanced Stability Oscillators using a Phononic Comb" and in its corresponding Non-Provisional patent application Ser. No. 16/932,455, filed on 17 Jul. 2020 and also entitled "Enhanced Stability Oscillators using a Phononic Comb". FIG. 4 is described in greater detail below.

The filtering concept realized by the embodiment of a circuit shown in FIG. 2 can also be applied to gradiometers utilizing a phononic comb as is taught by the other patent applications referenced above.

Turning again to FIG. 2, the output of the Drive Oscillator 10 is applied to the Band Pass Filter 30 before being applied to a Non-Linear Resonator 40 where the comb is formed with "large teeth separations" which allows a long-standing desire within the oscillator design community to implement filtering an oscillator output to reduce phase noise. The phrase "large teeth separation" is meant to refer to a tooth separation larger than the bandwidth of the narrow bandpass filter 30 which can be as small as 0.01% of the center frequency. Thus, for a 100 MHz comb, a large tooth separation is >10 kHz. This has always been impossible with a single tone output since the Full Width at Half Maximum (FWHM) Band Width (SW) of the oscillator is always much smaller, due to its very high Q, than any filter SW. By locking an external oscillator (preferably in a Phase Locked Loop (PLL) 50 with a phase noise essentially the same as the drive oscillator 10) to a particular tooth of the comb after filtering the drive noise near the tooth, the external oscillator phase noise (at output 60) can be reduced.

As noted above in the discussion with reference to FIG. 1, the signal $S_1$ applied to the Non-Linear Resonator 40 generates the comb $S_2$ provided signal $S_1$ is of a sufficient magnitude to cause teeth (also called a comb herein) to be generated by the Non-Linear Resonator 40. Two amplifiers 32 and 34 in the embodiment of FIG. 2 provide the gain or signal magnitude needed to generate the comb in Non-Linear Resonator 40. In some embodiments, a single amplifier (or even additional amplifiers) may be used instead of the pair of amplifiers 32 and 34 shown on either side of the passband filter 30 in FIG. 2. Most of the gain is preferably generated by the second amplifier 34 since a resonator functioning as the Non-Linear Resonator 40 desirously operates in a non-linear regime whereas the passband filter 30, which is preferably implemented by a resonator, should not see an input signal to the passband filter 30 of such a magnitude that its resonator would enter a non-linear regime. Having one resonator (resonator 40) operate in a non-linear regime is desirable as that causes the comb $S_2$ to be generated. Resonators in the Drive Oscillator 10, and in the passband filter 30, and in or associated with the PLL 50 (see oscillator 55, for example) should not operate in a non-linear regime for reasons which should now be apparent to the reader.

The amplifiers 32 and 34 are preferably implemented as Low Noise Amplifiers (LNAs) and moreover may desirably be set up in an Automatic Gain Control (AGC) configuration to more tightly control the amplitude of the signal $S_1$ applied to the Non-Linear Resonator 40.

Figure 3:
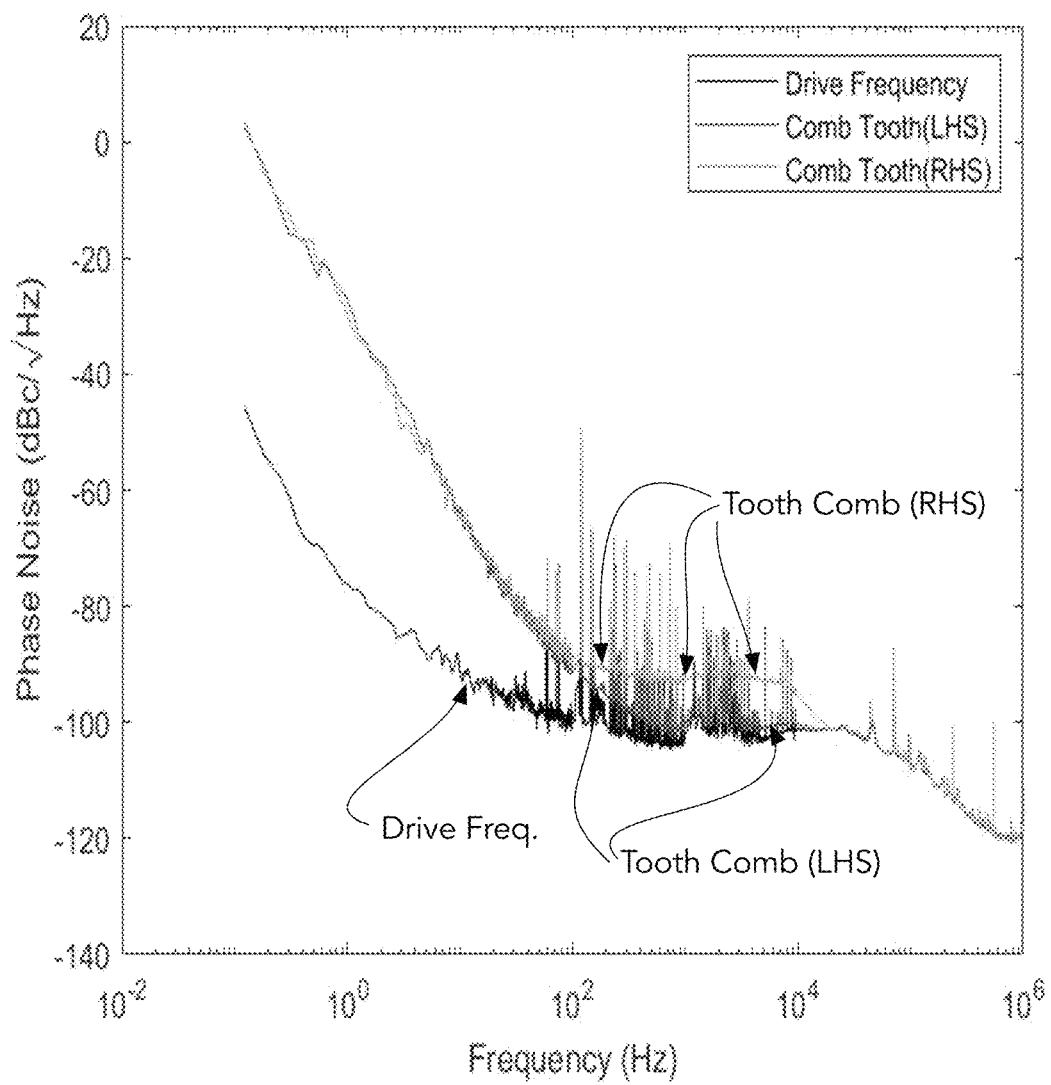
FIG. 3 is a graph depicting the phase noise of the drive signal from a precision frequency generator and the phase noise of two comb teeth of each side of the drive frequency shown in FIG. 1. The SNR of the comb tooth on the Left Hand Side (LHS) of the drive frequency was approximately the same as the drive, but the SNR of the comb tooth on the Right Hand Side (RHS) of the drive frequency was lower. Similarly, the phase noise on the comb tooth on the LHS of the drive frequency is almost the same as the drive signal while the phase noise of the comb tooth on the RHS of the drive frequency was higher above 100 Hz. The phase noise of the comb teeth below 100 Hz was believed to be increased by AM to PM noise conversion.

In FIG. 3, the phase noise of a precision signal generator is shown along with the phase noise of the teeth in the comb both on the right-hand side (RHS) and left-hand side (LHS) of the drive signal at 100.148 MHz. The comb output $S_2$ was passed through a lock-in amplifier to select the different frequencies before being measured by a Symmetricom phase measurement unit. Below 100 Hz offset frequency (horizontal axis), the phase noise of the drive is much lower than the comb teeth due to possible AM to PM noise conversion from the drive signal into the comb (see "PM AM correlation measurements and analysis," Howe, D. A., Hati, A, Nelson, C. W., & Lirette, D. (2012, May) in 2012 *IEEE International Frequency Control Symposium Proceedings* (pp. 1-5). IEEE). This source of noise can be reduced using a simple AM detector and a phase shifter (see "Reducing oscillator PM noise from AM-PM noise correlation." Hati, Archita, Craig W. Nelson, and David A. Howe, *Electronics letters* 50.17 (2014): 1195-1197). However, between 100 Hz and 1 kHz, the noise of the LHS tooth approaches that of the drive since the SNR as seen in FIG. 1 is nearly the same for the two signals. The RHS tooth phase noise is degraded since its SNR is lower. Above 10 kHz, the phase noise was limited by noise in the lock-in amplifier.

FIG. 4 shows the basic components of an embodiment of the present invention used in connection with the oscillator depicted in FIG. 1 of U.S. Provisional Patent Application Ser. No. 62/904,052 filed 23 Sep. 2019 and entitled "Enhanced Stability Oscillators using a Phononic Comb" and of its corresponding Non-Provisional patent Ser. No. 16/932,455, filed on 17 Jul. 2020 and also entitled "Enhanced Stability Oscillators using a Phononic Comb". The improved oscillator of FIG. 4 has a first VCXO (VCXO 10) comprising a resonator 20, and a Non-Linear Oscillator (NLXO) comprising a resonator 40 and preferably also a second VCXO (VCXO 50") acting as a sensor or oscillator with electronics 50' comprising a mixer, a phase detector, and feedback circuit, thus functioning as a PLL circuit 50. The bandwidth of the PLL is determined by filtering used in the feedback circuitry. Various embodiments of PLLs are well known with one embodiment of same including electronics 50' provided, at least in part, by a Phase Detector/ Frequency Synthesizer model ADF4002 made by Analog Device of Norwood, Mass. Other PPL designs may alternatively be used by those skilled in the art.

The resonators may be quartz type resonators with metallic electrodes formed thereon. The metallic electrodes of resonator 20 are labeled with numeral 22 while the metallic electrodes of resonator 40 are labeled with numeral 42. The tuning capacitor of VCXO 10 helps set the output frequency $f_D$ thereof to a desirable frequency for generating the comb S2 by the NLXO.

The drive signal at frequency $f_D$ generated by a first VCXO (VCXO 10) is preferably amplified by an amplifier 32 and preferably stabilized with an Automatic Gain Control (AGC) circuit 34. The amplifier 32 may be implemented as a Low Noise Amplifier (LNA) as may the AGC circuit 34. A bandpass filter 30 is connected in series between the amplifier 32 and circuit 34 or before the amplifier 32 depending on the power limitations of bandpass filter. The functions of amplifier 32, the AGC circuit 34 and the bandpass filter 30 have been previously discussed with reference to FIG. 2, although the circuit 34 in the embodiment of FIG. 2 is preferably a low noise amplifier preferably with AGC attributes. The AGC circuit 34 of FIG. 4 may similarly be a low noise amplifier preferably with AGC attributes.

Figure 5:
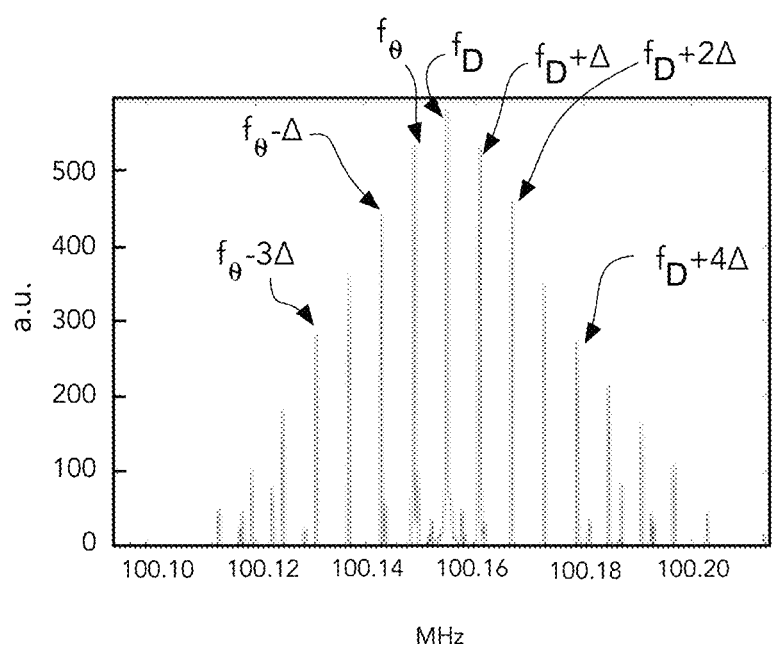
FIG. 5 is a graph depicting the amplitudes of the teeth of a phononic frequency comb produced when a 100-MHz AT-cut resonator is driven off-resonance by roughly 5 kHz from its first anharmonic mode at a drive level of 15 dBm.

The output $S_1$ at frequency $f_D$ from VCXO 10 is applied to resonator 40 in NLXO via the aforementioned amplifiers 32 and 34 and the filter 30, the resonator 40 having a resonant response at a frequency $f_0$. With appropriate modal coupling within resonator 40 and at drive levels sufficient to produce non-linear coupling between the modes, a frequency comb, $S_2$, is generated as shown graphically in FIG. 4 and experimentally in FIG. 5. The nonlinear response in the preferably quartz material of the resonator 40 is evidenced by the generation of a frequency comb at $f_\Theta$, $f_\Theta \pm \Delta$, $f_\Theta \pm 2\Delta$, $f_\Theta \pm 3\Delta$ ... $f_\Theta \pm n\Delta$, where $\Delta = f_D - f_\Theta$. When so driven, resonator 40 may be characterized as a non-linear resonator element which forms a non-linear crystal resonator oscillator (NLXO).

As has been described in U.S. Provisional Patent Application Ser. No. 62/904,052 filed 23 Sep. 2019 and entitled "Enhanced Stability Oscillators using a Phononic Comb" and in its corresponding Non-Provisional patent application Ser. No. 16/932,455, filed on 17 Jul. 2020 and also entitled "Enhanced Stability Oscillators using a Phononic Comb", it has been observed that for particular teeth of the comb and for a range of drive frequencies, the output frequencies of a tooth can be independent (or substantially independent) of the drive frequency as evidenced by large slopes (or substantially large slopes) of the plots of the drive frequencies versus the comb output frequencies shown in FIG. 3 of U.S. patent application Ser. No. 16/932,455, filed on 17 Jul. 2020 and entitled "Enhanced Stability Oscillators using a Phononic Comb". A "large" slope, as that term is used therein, is characterized by a nearly vertical representation of a tooth frequency on FIG. 3 of that application. While an infinite slope might be ideal in order for the output frequencies of the teeth to be independent (or substantially independent) of the drive frequency, a slope greater than 1 is an improvement in terms of making the output frequency of a selected tooth less dependent on the drive frequency $f_D$ than just using the drive frequency $f_D$ as a clock.

In most oscillators, the far-out phase noise is determined by the electronic noise in its sustaining circuit. This noise will not be present on the modes of a resonator which is not used within a sustaining circuit; thus, by locking a second VCXO (VCXO 50") to a selected one (an $n^{th}$ tooth) of these teeth within PLL 50, for example, or the PPL in electronics 50' and using the error signal of the PLL in electronics 50' to correct for relative changes in frequency between VCXO (VCXO 50") and $S_2$, the output frequency of second VCXO (VCXO 50") can be stabilized to a level provided by the $n^{th}$ tooth of the comb. Using a tuning capacitor in VCXO 10, one can tune the frequency of the drive signal S1 to the highest slope and lowest noise condition. For ease of illustration, only the higher frequency teeth are specifically shown in FIG. 4 while teeth on either side of the drive frequency are identified on FIG. 5, it being understood that the comb typically appears on both sides of the drive frequency $f_D$ at frequencies shown on FIG. 4.

While selecting a particular ($n^{th}$) tooth can be helpful to reduce noise in the output from VCXO 50", adding filter 30 between VCXO 10 and the NLXO is additionally helpful and may be used with (or without) the noise improving technology of U.S. Provisional Patent Application Ser. No. 62/904,052 filed 23 Sep. 2019 and entitled "Enhanced Stability Oscillators using a Phononic Comb" and in its corresponding Non-Provisional patent application Ser. No. 16/932,455, filed on 17 Jul. 2020 and also entitled "Enhanced Stability Oscillators using a Phononic Comb". Turning again to FIG. 4, the output of the VCXO 10 is applied to the Band Pass Filter 30 before being applied to a Non-Linear Resonator 40 where the comb is formed with large teeth separations which allows a long-standing desire within the oscillator design community to implement filtering an oscillator output to reduce phase noise. This has always been impossible with a single tone output since the FWHM SW of the oscillator is always much smaller than any filter SW. By locking an external oscillator with a similar phase noise as the drive oscillator 10 to a particular tooth of the comb with a Phase Locked Loop (PLL), the external oscillator phase noise (at output 60) can be reduced.

The inventors of the presently disclosed technology have observed that the high frequency jitter of first VCXO (VCXO 10) can be substantially reduced using this technique. Since a large portion of the phase noise of an oscillator is due to noise within the sustaining circuit for VCXO 10, this noise will not be present in resonator 40. Thus, the large slope region (left side of the comb in FIG. 3 of U.S. patent application Ser. No. 16/932,455, filed on 17 Jul. 2020 entitled "Enhanced Stability Oscillators using a Phononic Comb") of a comb will tend to filter out electronic noise.

The above design can preferably be implemented in a quartz MEMS fabrication process in which VCXO 10, filter 30, resonator 40, and VCXO 20 are all integrated with the PLL 50 electronics on a common semiconductor (Si, for example) substrate using quartz piezoelectric resonators. This will provide a chip-scale oscillator with dimensions of roughly $\leq 20$ mm$^3$ (a single quartz MEMS TCXO has been demonstrated with dimensions of 2×3 mm$^2$, see R. L. Kubena, et al., "A Fully Integrated Quartz MEMS VHF TCXO," 2017 IEEE Frequency Control Symposium, Besancon, Fr., pp. 68-71, July 2017, which is hereby incorporated by reference). In addition, the components can be ovenized for additional stability over temperature leading to a comb-enhanced OCXO. Finally, although quartz resonators have demonstrated high-Q combs with these unique features, other MEMS resonators formed of materials such as Si or AlN may be utilized instead so as long as they demonstrate the desired nonlinear and modal coupling effects.

The filter 30 is described herein as a passband filter but either a high pass or a low pass filter may be used instead depending upon which tooth is selected as the n$^{th}$ tooth mentioned herein. This would depend, for example, on whether the selected n$^{th}$ tooth is on the right-hand side (RHS) or left-hand side (LHS) of the drive signal from oscillator 10 (VCXO 10).

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A method for increasing the Signal to Noise Ratio (SNR) of phononic comb teeth generated by a non-linear resonator, the method comprising:
   generating a drive signal;
   applying the drive signal to the non-linear resonator with sufficient gain to generate the phononic comb teeth; and
   filtering the drive signal before applying it to the non-linear resonator to thereby increase the Noise Ratio (SNR) of phononic comb teeth generated by the non-linear resonator.

2. The method of claim 1 where the non-linear resonator includes a MEMS quartz resonator having a quartz element with metallic electrodes affixed to the quartz element.

3. The method of claim 2 wherein the non-linear resonator includes an AT-cut shear mode resonator.

4. The method of claim 1 wherein the filter is a passband filter having a 3 db passband width that is less than a tooth spacing of a selected tooth of the phononic comb teeth generated by the non-linear resonator, the selected tooth having a frequency at least one tooth spacing either above or below a frequency of said drive signal.

5. The method of claim 1 wherein the filter is a passband filter having two or more poles.

6. The method of claim 1 wherein the filter comprises a high pass filter for filtering the teeth occurring at lower frequencies than the drive signal frequency.

7. The method of claim 1 wherein the filter comprises a low pass filter for filtering the teeth occurring at higher frequencies than the drive signal frequency.

8. The method of claim 1 wherein the filter comprises a filter resonator and wherein the drive signal has sufficient gain to cause the non-linear resonator to enter a non-liner mode but not sufficient gain to cause the filter resonator to enter a non-liner mode.

9. The method of claim 1 wherein the filter comprises a Radio Frequency (RF) filter.

10. An apparatus generating phononic comb teeth comprising:
   a. an oscillator generating a drive signal;
   b. a resonator;
   c. a circuit for applying the drive signal to the resonator with sufficient gain to cause the resonator to enter a non-linear state wherein it generates an output having a phononic comb comprising a plurality of phononic comb teeth; and d. a filter for filtering the drive signal before applying it to the resonator to thereby increase a Noise Ratio (SNR) of phononic comb teeth generated by the resonator.

11. The apparatus of claim 10 where the resonator is a MEMS quartz resonator.

12. The apparatus of claim 11 wherein the resonator is an AT-cut shear mode MEMS resonator, having a quartz element with metallic electrodes affixed to the quartz element.

13. The apparatus of claim 10 wherein the filter is a passband filter having a 3 db passband width which is less than the teeth spacing a selected tooth of the phononic comb teeth generated by the resonator, the selected tooth having a frequency at least one tooth spacing either above or below a frequency of said drive signal.

14. The apparatus of claim 10 wherein the filter is a passband filter having two or more poles.

15. The apparatus of claim 10 wherein the filter comprises a high pass filter for filtering the teeth occurring at lower frequencies than the drive signal frequency.

16. The apparatus of claim 10 wherein the filter comprises a low pass filter for filtering the teeth occurring at higher frequencies than the drive signal frequency.

17. The apparatus of claim 10 wherein the drive signal is a RF drive signal and the filter comprises a Radio Frequency (RF) filter.

18. A circuit for improving a Signal to Noise Ratio (SNR) of phononic comb teeth generated by a non-linear resonator that is pumped by an oscillator generating a radio frequency drive signal with sufficient gain to cause the phononic comb teeth to be generated by the non-linear resonator, the circuit comprising a radio frequency filter disposed between the oscillator and the non-linear resonator.

19. The circuit of claim 18 wherein the filter has a 3 db passband width which is less than a single tooth spacing of the phononic comb teeth generated by the non-linear resonator, the filter selecting a desired tooth from the phononic comb teeth generated by the non-linear resonator, the desired tooth being at least one tooth spacing above or below said radio frequency drive signal.

20. The circuit of claim 18 wherein the filter comprises a Radio Frequency (RF) filter.

21. A method for improving the Signal to Noise Ratio (SNR) of phononic comb teeth generated by a non-linear resonator, the method comprising:
generating a drive signal;
filtering the drive signal using a filter; and
applying the filtered drive signal to the non-linear resonator, the filtered drive signal having sufficient gain to generate phononic comb teeth in the non-linear resonator.

22. The method of claim 21 where the non-linear resonator includes a MEMS AT-cut shear mode quartz resonator.

23. The method of claim 21 wherein the filter is a passband filter having a 3 db passband width that is less than a tooth spacing of the phononic comb teeth generated by the non-linear resonator, the filter selecting a tooth from the phononic comb teeth generated by the non-linear resonator, the selected tooth being spaced frequency-wise from the drive signal by at least one tooth spacing.

24. The method of claim 21 wherein the filter is a passband filter having two or more poles.

25. The method of claim 21 wherein the filter comprises a high pass filter for filtering the teeth occurring at lower frequencies than the drive signal frequency.

26. The method of claim 21 wherein the filter comprises a low pass filter for filtering the teeth occurring at higher frequencies than the drive signal frequency.

27. The method of claim 21 wherein the filter comprises a Radio Frequency (RF) filter.

* * * * *